(12) United States Patent
Lee et al.

(10) Patent No.: US 8,217,393 B2
(45) Date of Patent: Jul. 10, 2012

(54) TEST DEVICE, SRAM TEST DEVICE, SEMICONDUCTOR INTEGRATED CIRCUIT DEVICE AND METHODS OF FABRICATING THE SAME

(75) Inventors: Sun-Jung Lee, Seoul (KR); Hong-Jae Shin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1002 days.

(21) Appl. No.: 12/222,476

(22) Filed: Aug. 11, 2008

(65) Prior Publication Data

US 2009/0050886 A1 Feb. 26, 2009

(30) Foreign Application Priority Data

Aug. 9, 2007 (KR) .................. 10-2007-0080267

(51) Int. Cl.
*H01L 23/58* (2006.01)
*G01R 31/26* (2006.01)

(52) U.S. Cl. .......................................... 257/48; 257/40

(58) Field of Classification Search .................. 257/48, 257/E21.661, E23.002, E27.098–E27.101, 257/E27.077, E21.254; 324/763
See application file for complete search history.

(56) References Cited

U.S. PATENT DOCUMENTS

| | | | |
|---|---|---|---|
| 6,977,512 B2 | 12/2005 | Duan et al. | |
| 7,741,195 B2 * | 6/2010 | Rashid et al. | 438/462 |
| 2003/0021138 A1 * | 1/2003 | Keeth et al. | 365/63 |
| 2003/0062521 A1 * | 4/2003 | Jang et al. | 257/48 |
| 2005/0030055 A1 * | 2/2005 | Tran et al. | 324/763 |
| 2008/0277660 A1 * | 11/2008 | Tsurume et al. | 257/48 |
| 2009/0166618 A1 * | 7/2009 | Mowry et al. | 257/48 |
| 2009/0236599 A1 * | 9/2009 | Chiou et al. | 257/48 |
| 2011/0001116 A1 * | 1/2011 | Greene et al. | 257/4 |

FOREIGN PATENT DOCUMENTS

| | | |
|---|---|---|
| KR | 10-2006-0086756 | 8/2006 |
| KR | 10-2006-0099691 | 9/2006 |

* cited by examiner

*Primary Examiner* — Dao H Nguyen
*Assistant Examiner* — Tram H Nguyen
(74) *Attorney, Agent, or Firm* — Harness, Dickey & Pierce, P.L.C.

(57) ABSTRACT

A test device, SRAM test device, semiconductor integrated circuit, and methods of fabricating the same are provided. The test device may include a first test active region extending in one direction on a semiconductor substrate, a second test active, apart from the first test active region, extending in one direction on a semiconductor substrate, a plurality of test gate lines crossing the test active regions, a plurality of test contacts on at least one of the test active regions and test gate lines, a plurality of conducting regions electrically connecting the test contacts, and a plurality of conductive wiring lines interconnecting the plurality of test contacts, wherein an open contact chain, which electrically connects the plurality of test contacts, is formed.

25 Claims, 6 Drawing Sheets

TEST DEVICE, SRAM TEST DEVICE, SEMICONDUCTOR INTEGRATED CIRCUIT DEVICE AND METHODS OF FABRICATING THE SAME

PRIORITY STATEMENT

This application claims priority under 35 U.S.C. §119 to Korean Patent Application No. 10-2007-0080267, filed on Aug. 9, 2007, in the Korean Intellectual Property Office (KIPO), the entire contents of which are herein incorporated by reference.

BACKGROUND

1. Field

Example embodiments relate to a test device, SRAM test device, a semiconductor integrated circuit device, and methods of fabricating the same. Other example embodiments relate to a test device, an SRAM test device, a semiconductor integrated circuit device, and methods of fabricating the same with improved productivity.

2. Description of the Related Art

Static random access memories (SRAMs) have a smaller memory capacity than dynamic random access memories (DRAMs), but a faster operation speed than the DRAMs. Accordingly, SRAMs are used in cache memories of computers or portable appliances where relatively high-speed operations are required.

SRAM cells are divided into thin film transistor cells (TFT cells) and/or full complementary metal oxide semiconductor cells (FCMOS cells). The FCMOS cells may include a plurality of pull-up and pull-down transistors that constitute a latch and a plurality of pass transistors to access the latch.

With the relatively high integration of a semiconductor memory device, memory cells are increasingly becoming smaller. As the size of the memory cells decreases, the size of metal contacts may also decrease. However, because the size of the metal contacts decreases, accurately patterning the metal contacts may become difficult, resulting in an increase in defective contacts. Therefore, it is very important to confirm and test whether contacts are securely formed and an upper region and a lower region of the semiconductor memory device are electrically connected to each other (e.g., whether the contacts open).

One method for testing whether contacts open in an SRAM device is a method using an electronic beam (E-beam). However, when using an electronic beam, a relatively large amount of time may be needed to perform the test, and productivity may be lowered. Further, a noise may occur due to instability of an electronic beam facility.

Another method for testing whether contacts open in the SRAM device is a method in which a test element is separately formed. Because the structures of the test element and an actual cell element are different, it may not be possible to accurately determine whether a contact opens in the cell element, even when the test element is used. For example, even though a test contact of the test element opens, the contact of the cell element may not open. In contrast, even though the test contact of the test element may not open, the contact of the cell element may open. As a result, the test may not be accurately performed, which results in lower productivity.

SUMMARY

Example embodiments provide a test device, an SRAM test device, and a semiconductor integrated circuit that has improved productivity, and methods of fabricating the same.

However, the aspects, features and advantages of example embodiments are not restricted to the ones set forth herein. The above and other aspects, features and advantages of example embodiments will become more apparent to one of ordinary skill in the art to which example embodiments pertain by referencing a detailed description of example embodiments given below.

According to example embodiments, a test device may include a first test active region extending in one direction on a semiconductor substrate, a second test active region, apart from the first test active region, extending in one direction on a semiconductor substrate, a plurality of test gate lines crossing the test active regions, a plurality of test contacts on at least one of the test active regions and the test gate lines, a plurality of conducting regions electrically connecting the test contacts, and a plurality of conductive wiring lines interconnecting the plurality of test contacts, wherein an open contact chain includes the plurality of conducting regions and the plurality of conductive wiring lines which electrically connects the plurality of test contacts.

According to example embodiments, an SRAM test device may include a plurality of conductive regions apart from each other on a semiconductor substrate, a plurality of contacts on the plurality of conductive regions, one or more connecting regions electrically connecting the plurality of conductive regions 2-by-2, and one or more conductive wiring lines electrically connecting the plurality of contacts, which are on the conductive regions that are not electrically connected to each other, 2-by-2, so as to form an open contact chain, wherein the conductive regions and the contacts have the same structure as those of a cell region to be tested.

According to example embodiments, a semiconductor integrated circuit may include a semiconductor substrate where a cell region and a test region are defined, first and second active regions on the cell region, a plurality of gate lines on the first active region or the second active region, a plurality of contacts on at least one of the active regions and gate lines, and a test device according to example embodiments.

According to example embodiments, a method of fabricating a test device may include forming a first test active region extending in one direction on a semiconductor substrate, forming a second test active region, apart from the first test active region, on the semiconductor substrate, the second test active region extending in one direction, forming a plurality of test gate lines on the test active regions, forming a plurality of test contacts on a least one of the test active regions and test gate lines, forming a plurality of conducting regions that electrically connect the test contacts, providing a plurality of conductive wiring lines interconnecting the plurality of test contacts, and forming an open contact chain by electrically connecting the plurality of test contacts via the plurality of conducting regions and the plurality of conductive wiring lines.

According to example embodiments, a method of fabricating an SRAM test device may include forming a plurality of conductive regions apart from each other on a semiconductor substrate, forming a plurality of contacts on the plurality of conductive regions, forming one or more connecting regions to electrically connect the plurality of conductive regions, 2-by-2, and forming an open contact chain by electrically connecting the plurality of contacts, which are formed on the conductive regions that are not electrically connected to each other, 2-by-2, via a plurality of conductive wires, wherein the conductive regions and the contacts have the same structure as those of a cell region to be tested.

According to example embodiments, a method of fabricating a semiconductor integrated circuit may include forming a semiconductor substrate where a cell region and a test region are defined, forming first and second active regions on the cell region, forming a plurality of gate lines on the first active region or the second active region, forming a plurality of contacts on at least one of the active regions and gate lines, and fabricating the test device according to example embodiments.

BRIEF DESCRIPTION OF THE DRAWINGS

Example embodiments will be more clearly understood from the following detailed description taken in conjunction with the accompanying drawings. FIGS. 1-5B represent non-limiting, example embodiments as described herein.

FIG. 1 is a circuit diagram illustrating an SRAM cell of a semiconductor integrated circuit according to example embodiments;

FIG. 2 is a layout diagram illustrating a cell region of an SRAM device according to example embodiments;

FIG. 4 is a diagram illustrating a modification of an SRAM device according to example embodiments;

FIG. 5B is a cross-sectional view taken along the line B-B' of FIG. 5A.

Figure 1:
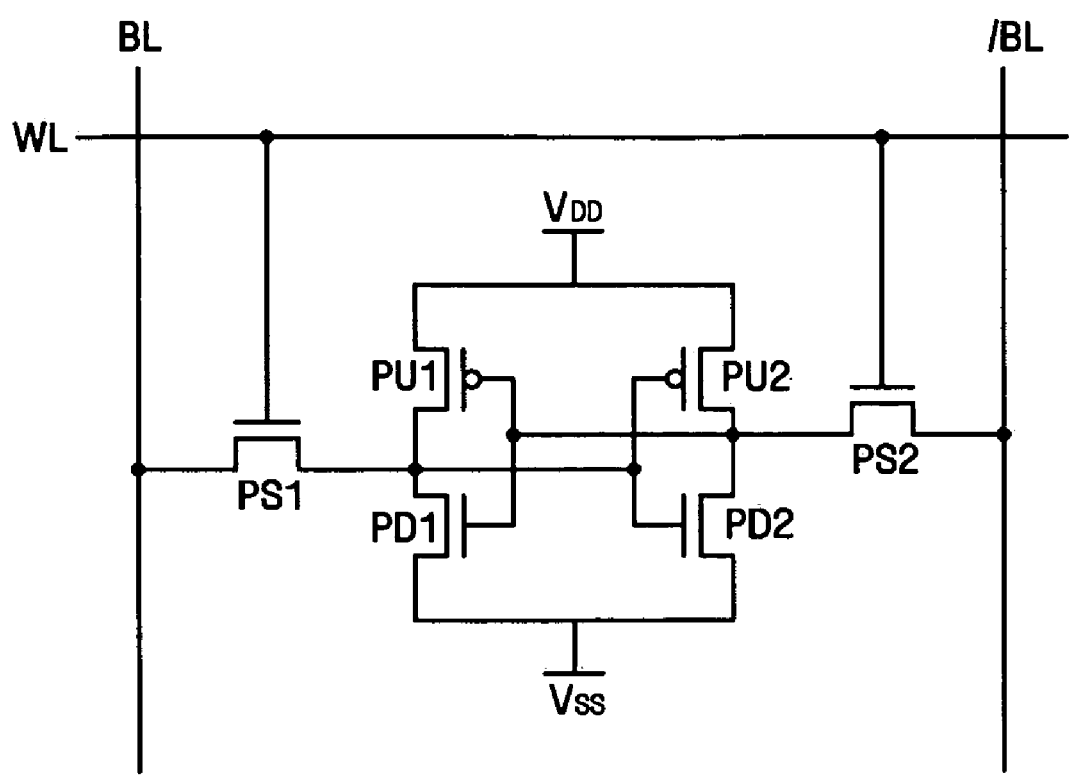

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments are described more fully hereinafter with reference to the accompanying drawings, in which example embodiments are shown. Example embodiments may, however, be embodied in many different forms and should not be construed as limited to the embodiments set forth herein. Rather, these embodiments are provided so that this disclosure will be thorough and complete, and will fully convey the scope of example embodiments to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements of features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes of regions of elements and do not limit example embodiments.

Hereinafter, the structure of an SRAM device according to example embodiments will be described in detail with reference to FIGS. 1 to 5B. The SRAM device may include a cell region and a test region that are defined on a semiconductor substrate.

FIG. 1 is a circuit diagram illustrating an SRAM cell of a semiconductor integrated circuit according to example embodiments. Referring to FIG. 1, according to example embodiments an SRAM device, may include an SRAM cell that may be formed in a cell region. The SRAM cell may include a plurality of pull-up transistors PU1 and PU2 and a plurality of pull-down transistors PD1 and PD2 which may constitute a latch, and a plurality of pass transistors PS1 and PS2 that may access the latch.

A unit cell of the SRAM cell may include first and second pass transistors PS1 and PS2, first and second pull-down transistors PD1 and PD2, and first and second pull-up transistors PU1 and PU2. Each of the first and second pass transistors PS1 and PS2, and the first and second pull-down transistors PD1 and PD2 may be composed of an NMOS transistor, and each of the first and second pull-up transistors PU1 and PU2 may be composed of a PMOS transistor. Sources of the first and second pull-down transistors PD1 and PD2 may be connected to a ground terminal VSS and sources of the first and second pull-up transistors PU1 and PU2 may be connected to a voltage terminal VDD.

Further, the first pull-down transistor PD1, which may be composed of the NMOS transistor, and the first pull-up transistor PU1, which may be composed of the PMOS transistor, may form a first inverter. The second pull-down transistor PD2 may be composed of the NMOS transistor, and the second pull-up transistor PU2 may be composed of the PMOS transistor. The pull-down transistor PD2 and pull-up transistor PU2 may form a second inverter.

Output terminals of the first and second inverters may be connected to sources of the first and second pass transistors PS1 and PS2, respectively. Input and output terminals of the first and second inverters may be connected to cross each other so as to constitute one latch. Drains of the first and second pass transistors PS1 and PS2 may be connected to first and second bit lines BL and /BL, respectively. The first and second pass transistors PS1 and PS2 may also connect to a wordline WL.

Figure 2:
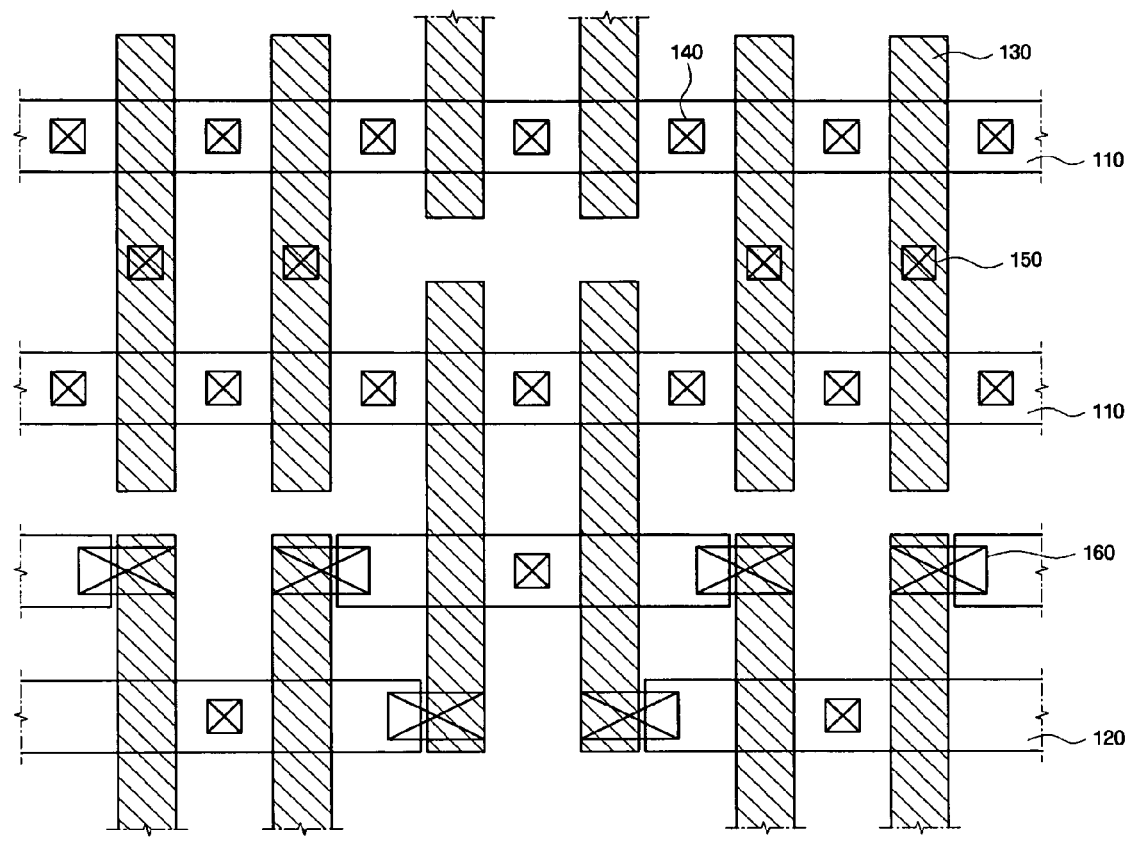

FIG. 2 is a layout diagram illustrating example embodiments of a cell region of an SRAM device. Referring to FIG. 2, a pair of first conductive active regions 110 may be formed in the cell region of the SRAM device. The pair of first conductive active regions 110 may extend in one direction so as to be parallel to each other. The first conductive active region 110 may be an N-type active region. A plurality of second conductive active regions 120 may be formed apart from the first conductive active regions 110 in different directions. The second conductive active region 120 may extend in one direction by a shorter distance than the first conductive active region 110. The second conductive active region 120 may be a P-type active region. A plurality of gate lines 130 may be formed to cross the first conductive active regions 110 or the second conductive active regions 120. The plurality of gate lines 130 may be formed to partially overlap the first conductive active regions 110 or the second conductive active regions 120, thereby forming transistors. Transistors, which may be formed in regions that overlap the first conductive active regions 110, may be N-type transistors, e.g., pull-down transistors or pass transistors. Transistors, which may be formed in regions that overlap the second conductive active region 120, may be P-type transistors, e.g., pull-up transistors.

Source/drain regions may be formed on both sides of regions where the first conductive active regions 110 or the second conductive active regions 120 and the plurality of gate lines 130 overlap, and a plurality of first contacts 140 may be formed on the source/drain regions. The plurality of first contacts 140 may connect the source/drain regions and upper wiring lines. Further, second contacts 150 may be formed on portions of the gate lines 130, and a voltage may be applied to the gate lines 130 through the second contacts 150. On portions of the gate lines 130 that are adjacent to the second conductive active regions 120, shared contacts 160 may be formed over the second conductive active regions 120 and the portions of the gate lines 130. Silicide regions may be formed on top surfaces of the first and second conductive active regions 110 and 120, which the gate lines 130 do not overlap, and the gate lines 130. The silicide regions may reduce contact resistance of the first contacts 140, the second contacts 150, and the shared contacts 160.

Figure 3A:
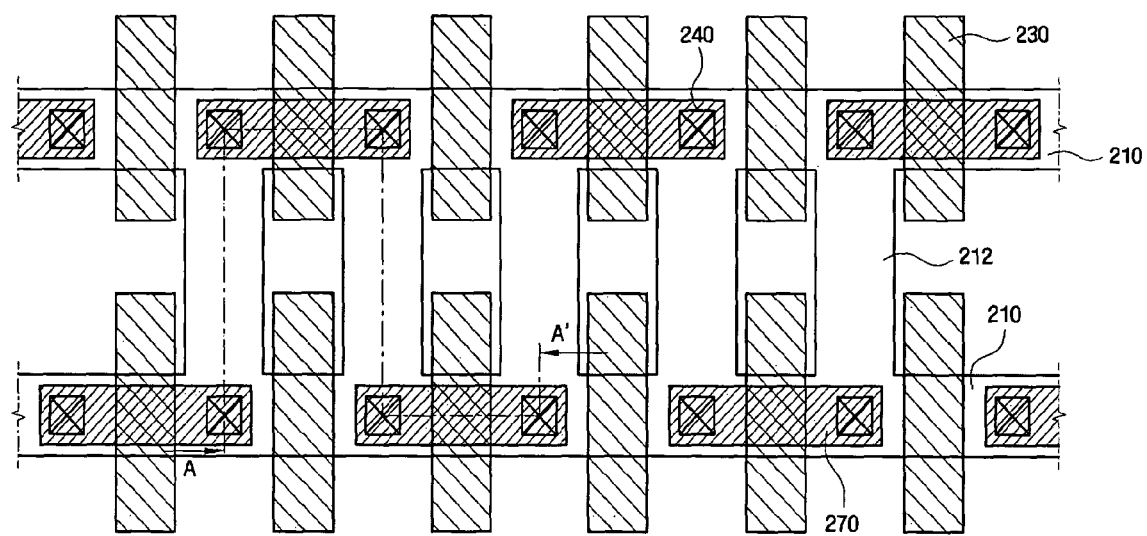
FIG. 3A is a layout diagram illustrating a test region of an SRAM device according to example embodiments.
Figure 3B:
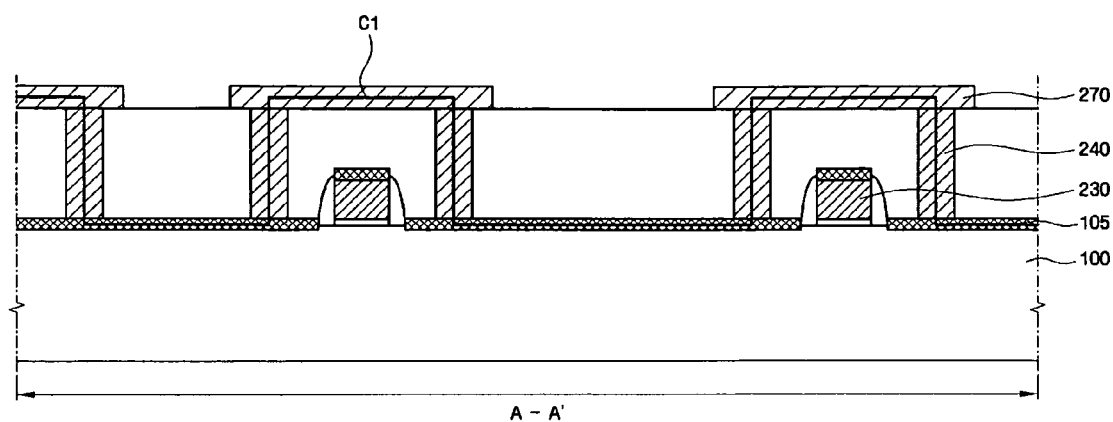
FIG. 3B is a cross-sectional view taken along the line A-A' of FIG. 3A.

FIG. 3A is a layout diagram illustrating example embodiments of a test region of an SRAM device. FIG. 3B is a cross-sectional view taken along the line A-A' of FIG. 3A. Referring to FIGS. 2 to 3B, a pair of test active regions 210 may be formed in the test region of the SRAM device. The pair of test active regions 210 may extend in one direction on the semiconductor substrate 100 so as to be parallel to each other in a separated state. The pair of test active regions 210 may be formed to correspond to the pair of first conductive active regions 110 of the cell region in FIG. 2, which means that the pair of test active regions 210 and the pair of first conductive active regions 110 may have the same intervals and sizes. The pair of test active regions 210 may be electrically connected to each other by a plurality of separated connecting active regions 212. For example, the pair of test active regions 210, which may be formed to be parallel to each other in one direction, may be connected by the plurality of connecting active regions 212, thereby forming a trapezoidal active region. Silicide regions 105 may be formed on the test active regions 210 and the connecting active regions 212, and thus, may be electrically connected to the test active regions 210 and the connecting active regions 212. The test active regions 210 may be divided into a plurality of regions by the gate lines 130, and the separation regions may not be electrically connected to each other.

A plurality of test gate lines 230 may be formed to cross the test active regions 210. On the test active regions 210, the plurality of test gate lines 230 may be formed to correspond to the gate lines 130 that are on the first conductive active regions 110 of the cell region. For example, the test gate lines 230 on the test active regions 210 may be formed to have the same sizes as the gate lines 130 on the first conductive active regions 110 that are at the same locations. However, in the regions other than the test active regions 210, the test gate lines 230 and the gate lines 130 may not need to correspond to each other. Referring to FIGS. 2 and 3A, a portion of the gate lines 130 of the cell region may be formed to overlap one or more of the first conductive active regions 110, while the test gate lines 230 of the test region may be formed such that one gate line 230 only overlaps one test active region 210. Electricity may be prevented or reduced from flowing through the test gate lines 230, even if the test contacts 240 do not open, where the test contacts 240, which are formed adjacent to the test gate lines 230, are electrically connected during a patterning process.

The pair of test active regions 210 may be divided into a plurality of separation regions by the plurality of test gate lines 230, and the plurality of test contacts 240 may be formed on the separation regions. The plurality of test contacts 240 may be connected to the test active regions 210, and the pair of test active regions 210 may be connected by the connecting active regions 212. Therefore, two contacts, which may be located opposite to each other on both ends of the connecting active region 212 in FIG. 3A, may become electrically connected to each other. The test contacts 240, which may be formed adjacent to each other in one direction on each test active region 210, may be connected by metal wiring lines 2-by-2. The plurality of metal wiring lines 270 may be formed in a zigzag, as shown in FIG. 3A.

According to example embodiments, an open contact chain C1, where the plurality of test contacts 240 that are formed on the pair of test active regions 210 that are electrically connected, may be formed. An input pad (not shown) may be formed on one side of the open contact chain C1, and an output pad (not shown) may be formed on the other side of the open contact chain C1. If a voltage is applied to the input pad, a current may flow through the open contact chain C1. If all of the test contacts 240 normally open, the applied current may be measured at the other side of the open contact chain C1. For example, because it is possible to simply test whether the plurality of test contacts 240 normally open, productivity may be improved.

In the SRAM device, according to example embodiments, the test active region 210 of the test region and the test contact 240 may be formed to correspond to the first conductive active region 110 of the cell region and the first contact 140. Accordingly, the test contacts 240 may be formed in the same environments as the first contacts 140 of the cell region. For example, if testing whether the test contacts 240 open, it may be possible to accurately predict whether the first contacts 140 open. Therefore, an accurate test may be performed, and thus, productivity may be improved.

Figure 4:
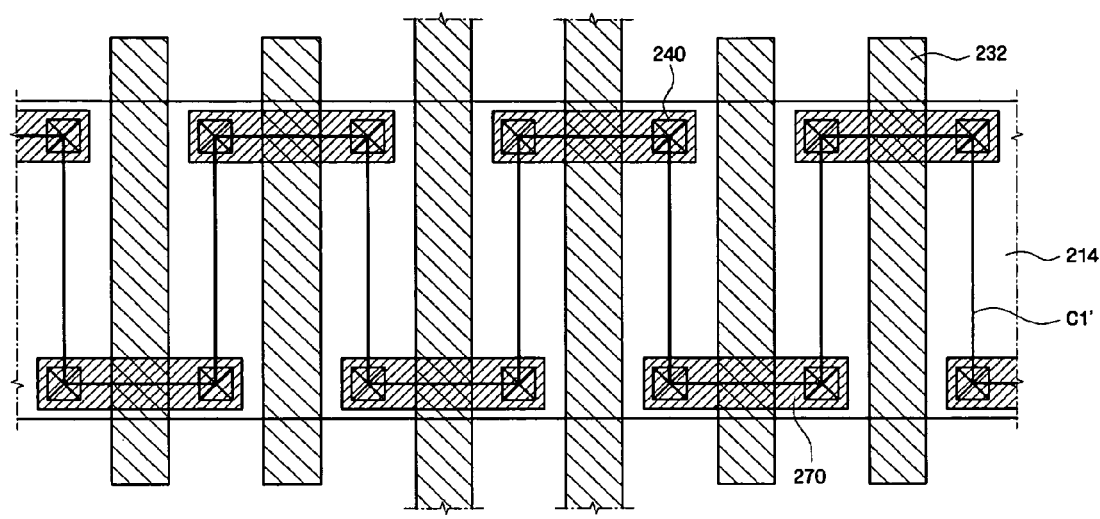

FIG. 4 is a diagram illustrating a modification of an SRAM device according to example embodiments. Referring to FIG. 4, instead of forming a pair of test active regions 210, one large test active region 214 may be formed. Test gate lines 232 may be formed to cross the test active region 214, such that test contacts 240 may be separated by 2-by-2. Separation regions of the test active region 214, which are divided by the test gate lines 232, may not be electrically connected to each other. A silicide region may be formed on each of the separation regions of the test active region 214 that are divided by the test gate lines 232. Because the silicide region is a conductive region, the two contacts 240, which are formed on each of the separation regions of the test active region 214, may be electrically connected to each other. The two test contacts 240, which may be formed on an adjacent separation region, may be connected by a metal wiring line 270. Accordingly, an open contact chain C1' may be formed. According to the modification that is shown in FIG. 4, because the open contact chain C1' is formed, it may be possible to simply and accurately determine whether the plurality of test contacts 240 open.

Figure 5A:
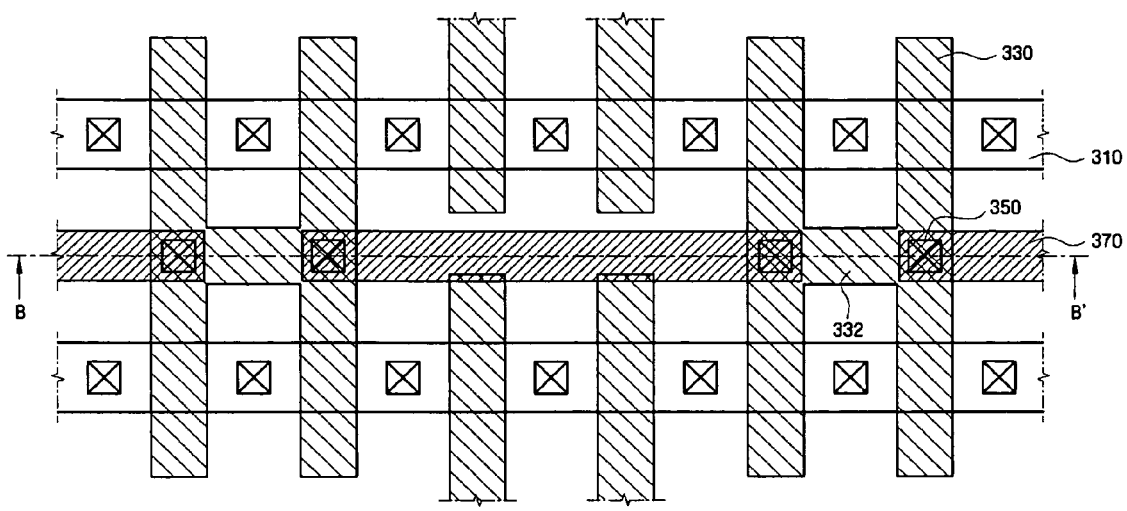
FIG. 5A is a layout diagram illustrating a test region of an SRAM device according to example embodiments.
Figure 5B:
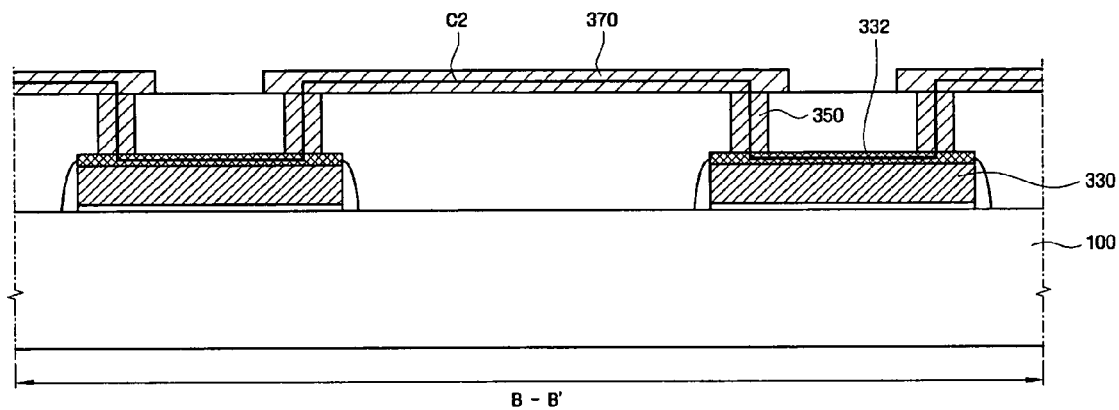

Hereinafter, an SRAM device according to example embodiments will be described with reference to FIGS. 5A and 5B. FIG. 5A is a layout diagram illustrating a test region of an SRAM device according to example embodiments. FIG. 5B is a cross-sectional view taken along the line B-B' of FIG. 5A.

Referring to FIGS. 2, 5, and 5B, test gate lines 330 may be formed in the test region of the SRAM device. The plurality of test gate lines 330 may be formed to be parallel to each other in one direction. The plurality of test gate lines 330 may be formed on the test active regions 310 and may cross the first test active region 310. Intervals between the test gate lines 330 may be different from each other. The plurality of test gate lines 330 may be formed to correspond to the plurality of gate lines 130 of the cell region.

The plurality of test gate lines 330 may be electrically connected by the connecting gate lines 332 in such a manner that the adjacent test gate lines may be electrically connected 2-by-2. For example, the pair of adjacent test gate lines 330 may be connected by the connecting gate line 332, thereby forming one structure.

The test contacts 350 may be formed on the test gate lines 330, respectively. The plurality of test contacts 350 may be formed to correspond to the second contacts 150 of the cell region. The two test contacts 350, which are formed on the pair of test gate lines 330 that are electrically connected by the connecting gate line 332, may be electrically connected to each other.

The test contact 350 on each test gate line 330, which may have the connecting gate line 332 formed on one side thereof, may be connected to another test contact 350 adjacent to the other side of each test gate line 330 by the metal wiring line 370. For example, the test gate line 330 may be connected to another test gate line 330 formed adjacent to one side of the corresponding test gate line 330 by the connecting gate line 332. The test contact 350, which may be formed on the test gate line 330, may be connected to another test contact 350 formed on another test gate line 330 by the metal wiring line 370. The open contact chain C2, which electrically connects the plurality of test contacts 350 that may be formed on the plurality of test gate lines 330, may be formed.

According to example embodiments of an SRAM device, it may be possible to form the open contact chain C2 by which the plurality of test contacts 350, which may be formed on the plurality of test gate lines 330, are electrically connected. An input pad (not shown) may be formed on one side of the open contact chain C2, and an output pad (not shown) may be formed on the other side of the open contact chain C2. If a voltage is applied to the input pad, a current may flow through the open contact chain C2. If all of the test contacts 350 normally open, the applied current may be measured on the other side of the open contact chain C2. For example, it may be possible to simply and accurately test whether the plurality of test contacts 350 normally open, and thus, productivity may be improved.

Further, the test gate lines 330 and the test contacts 350 of the test region of the SRAM device may be formed to correspond to the gate lines 130 and the second contacts 150 of the cell region. Accordingly, the test contacts 350 of the test region may be formed in the same environments as the second contacts 150 of the cell region. For example, if testing whether the test contacts 350 open, it may be possible to accurately know whether the second contacts 150 open. Accordingly, because an accurate test may be performed, productivity may be improved.

The SRAM devices according to the above-described embodiments may achieve the following effects. In the SRAM device, the open contact chain, which electrically connects the plurality of test contacts, may be formed. For example, because it is possible to simply test whether the plurality of test contacts normally open, productivity may be improved.

Further, the test contacts of the test region of the SRAM device may be formed to correspond to the contacts of the cell region. Accordingly, if testing whether the test contacts open, it may be possible to accurately predict whether the contacts in the cell region open. For example, because an accurate test may be performed, productivity may be improved.

Although example embodiments have been described with reference to the accompanying drawings, it will be apparent to those skilled in the art that various modifications and changes may be made thereto without departing from the scope and spirit of example embodiments. Therefore, it should be understood that the above embodiments are not limitative, but illustrative in all aspects.

What is claimed is:

1. A test device comprising:
   a first test active region extending in one direction on a semiconductor substrate;
   a second test active region, apart from the first test active region, extending in one direction on the semiconductor substrate;
   a plurality of test gate lines crossing the first test active region or the second test active region;
   a plurality of test contacts on at least one of the test active regions and the test gate lines;
   a plurality of conducting regions electrically connecting the test contacts; and
   a plurality of conductive wiring lines interconnecting the plurality of test contacts,
   wherein an open contact chain includes the plurality of conducting regions and the plurality of conductive wiring lines which electrically connects the plurality of test contacts.

2. The test device of claim 1, wherein:
   the plurality of test gate lines cross the first test active region or the second test active region;
   the plurality of test contacts are adjacent to the plurality of test gate lines and on the first and second test active regions;

the plurality of conducting regions are a plurality of connecting active regions connecting the first test active region with the second test active region electrically connecting the test contacts on the first test active region and the test contacts on the second test active region; and the plurality of conductive wiring lines electrically connects two test contacts adjacent to each other on the first test active region or the second test active region.

3. The test device of claim 2, wherein the open contact chain tests whether the plurality of test contacts is open.

4. The test device of claim 2, wherein:
the first and second test active regions are divided into a plurality of regions by the plurality of test gate lines, and
a silicide region is on each of the regions that are divided by the test gate lines.

5. The test device of claim 4, wherein each of the first and second test active regions is an N-type active region.

6. The test device of claim 2, wherein silicide regions are on the connecting active regions.

7. The test device of claim 2, wherein each of the test gate lines selectively crosses either the first test active region or the second test active region.

8. The test device of claim 2, further comprising:
an input pad connected to one side of the open contact chain; and
an output pad connected to the other side of the open contact chain.

9. The test device of claim 2, wherein:
an SRAM cell region and an SRAM test region are on the semiconductor substrate; and
the first and second test active regions, the test gate lines, the test contacts, the connecting active regions, and the conductive wiring lines are formed on the SRAM test region.

10. The test device of claim 9, wherein:
first and second active regions, a plurality of gate lines, and a plurality of contacts are on the SRAM cell region; and
the first and second test active regions correspond to the first and second active regions, the test gate lines correspond to the gate lines, and the test contacts correspond to the contacts.

11. The test device of claim 1, wherein:
the plurality of test gate lines are parallel to each other in one direction and the test contacts are thereon;
the plurality of conducting regions are one or more connecting gate lines electrically connecting the test gate lines in such a manner that the adjacent test gate lines are electrically connected to each other 2-by-2; and
the conductive wiring lines connects one test contact on each test gate line where a connecting gate line is formed at one side of each test gate line to another test contact adjacent to the other side of each test gate line.

12. The test device of claim 11, wherein the open contact chain tests whether the plurality of test contacts open.

13. The test device of claim 11, further comprising:
an input pad connected to one side of the open contact chain; and
an output pad connected to the other side of the open contact chain.

14. The test device of claim 11, wherein:
an SRAM cell region and an SRAM test region are defined on the semiconductor substrate; and
the test gate lines, the connecting gate lines, and the conductive wiring lines are on the SRAM test region.

15. The test device of claim 14, wherein:
gate lines, and a plurality of contacts on the gate lines, are on the SRAM cell region; and the test gate lines correspond to the gate lines and the test contacts correspond to the contacts.

16. An SRAM test device comprising:
a plurality of conductive regions apart from each other on a semiconductor substrate;
a plurality of contacts on the plurality of conductive regions;
one or more connecting regions electrically connecting the plurality of conductive regions 2-by-2; and
one or more conductive wiring lines electrically connecting the plurality of contacts, which are on the conductive regions that are not electrically connected to each other, 2-by-2, so as to form an open contact chain,
wherein the conductive regions and the contacts have the same structure as those of a cell region to be tested.

17. The SRAM test device of claim 16, wherein the conductive regions and the connecting regions are silicide regions that are formed on active regions.

18. The SRAM test device of claim 17, wherein the active region is an N-type active region.

19. The SRAM test device of claim 16, wherein the conductive regions and the connecting regions are polysilicon regions.

20. The SRAM test device of claim 16, wherein the conductive regions are gate lines and the connecting regions are connecting gate lines.

21. The SRAM test device of claim 16, further comprising:
an input pad connected to one side of the open contact chain; and
an output pad connected to the other side of the open contact chain.

22. A semiconductor integrated circuit device comprising:
a semiconductor substrate where a cell region and a test region are defined;
first and second active regions on the cell region;
a plurality of gate lines on the first active region or the second active region;
a plurality of contacts on at least one of the active regions and gate lines; and
the test device according to claim 1.

23. The semiconductor integrated circuit of claim 22 wherein:
the first and second active regions extend in one direction on the cell region so as to be parallel to each other;
the plurality of contacts are adjacent to the gate lines and on the first and second active regions;
the first and second test active regions on the test region correspond to the first and second active regions on the cell region;
the plurality of test gate lines on the first and second test active regions correspond to the gate lines;
the plurality of test contacts on the first and second test active regions correspond to the contacts;
the plurality of conducting regions are connecting active regions which connect the first test active region with the second test active region electrically connecting the test contacts on the first and second test regions 2-by-2; and
the conductive wiring lines electrically connect two test contacts that are formed adjacent to each other on the first test active region or the second test active region.

24. The semiconductor integrated circuit of claim 23, wherein a silicide region is on each of the first and second active region, the first and second test active regions, and the connecting active regions.

25. A semiconductor integrated circuit of claim 22 wherein:

the plurality of gate lines are parallel to each other in one direction on the cell region;

the plurality of contacts are on the plurality of gate lines;

the plurality of test gate lines on the test region correspond to the plurality of gate lines;

the plurality of test contacts on the plurality of test gate lines correspond to the plurality of contacts;

the plurality of conductive regions are one or more connecting gate lines which electrically connect the test gate lines in such a manner that the adjacent test gate lines are electrically connected to each other 2-by-2; and the plurality of conductive wiring lines connects one test contact on each test gate line where a connecting gate line is at one side of each test gate line to another test contact adjacent to the other side of each test gate line.

* * * * *